(12) United States Patent
Nathan et al.

(10) Patent No.: US 8,165,318 B2
(45) Date of Patent: *Apr. 24, 2012

(54) PROCESS FOR ADJUSTING THE SOUND VOLUME OF A DIGITAL SOUND RECORDING

(75) Inventors: Guy Nathan, Nun's Island (CA); Dominique Dion, Laval (CA)

(73) Assignee: TouchTunes Music Corporation, New York, NY (US)

( * ) Notice: Subject to any disclaimer, the term of this patent is extended or adjusted under 35 U.S.C. 154(b) by 1266 days.

This patent is subject to a terminal disclaimer.

(21) Appl. No.: 11/513,018

(22) Filed: Aug. 31, 2006

(65) Prior Publication Data

US 2006/0293773 A1    Dec. 28, 2006

Related U.S. Application Data

(63) Continuation of application No. 09/583,864, filed on Jun. 1, 2000, now Pat. No. 7,107,109.

(30) Foreign Application Priority Data

Feb. 16, 2000 (FR) ...................................... 00 01905

(51) Int. Cl.
*H03G 3/00* (2006.01)
(52) U.S. Cl. ........ 381/104; 381/102; 381/103; 381/106; 381/107; 381/57; 381/321; 700/94
(58) Field of Classification Search .................. 381/102, 381/103, 106, 107, 104, 57, 321; 700/94
See application file for complete search history.

(56) References Cited

U.S. PATENT DOCUMENTS

| | | |
|---|---|---|
| 3,982,620 A | 9/1976 | Kotenhaus |
| 4,186,438 A | 1/1980 | Benson |
| 4,232,295 A | 11/1980 | McConnell |
| 4,335,809 A | 6/1982 | Wain |
| 4,335,908 A | 6/1982 | Burge |
| 4,412,292 A | 10/1983 | Sedam |
| 4,521,014 A | 6/1985 | Sitrick |
| 4,528,643 A | 7/1985 | Freeny |

(Continued)

FOREIGN PATENT DOCUMENTS

| | | |
|---|---|---|
| AU | 199954012 | 4/2000 |

(Continued)

OTHER PUBLICATIONS

Patent Abstract of Japan vol. 95, No. 010 & JP 07 281682 A (Naguo Yuasa), 27 Oct. 1 JP 07 281682, figure 1-6 abrége.

(Continued)

*Primary Examiner* — Vivian Chin
*Assistant Examiner* — Paul Kim
(74) *Attorney, Agent, or Firm* — Nixon & Vanderhye PC

(57) ABSTRACT

The present invention relates to a process for adjusting the sound volume of a digital sound recording characterized in that it comprises:

a step consisting of determining, in absolute values, for a recording, the maximum amplitude values for sound frequencies audible for the human ear, a step consisting of calculating the possible gain for a specified sound level setting, between the maximum amplitude value determined above and the maximum amplitude value for all frequencies combined, a step consisting of reproducing the recording with a sound card by automatically adjusting the amplification gain level making it possible to obtain a sound level for the recording of a specified value so that it corresponds to the gain calculated for this recording.

8 Claims, 3 Drawing Sheets

U.S. PATENT DOCUMENTS

| | | |
|---|---|---|
| 4,558,413 A | 12/1985 | Schmidt |
| 4,572,509 A | 2/1986 | Sitrick |
| 4,582,324 A | 4/1986 | Koza |
| 4,593,904 A | 6/1986 | Graves |
| 4,597,058 A | 6/1986 | Izumi |
| 4,636,951 A | 1/1987 | Harlick |
| 4,652,998 A | 3/1987 | Koza |
| 4,654,799 A | 3/1987 | Ogaki |
| 4,658,093 A | 4/1987 | Hellman |
| 4,667,802 A | 5/1987 | Verduin |
| 4,675,538 A | 6/1987 | Epstein |
| 4,677,311 A | 6/1987 | Morita |
| 4,677,565 A | 6/1987 | Ogaki |
| 4,703,465 A | 10/1987 | Parker |
| 4,707,804 A | 11/1987 | Leal |
| 4,722,053 A | 1/1988 | Dubno |
| 4,761,684 A | 8/1988 | Clark |
| 4,766,581 A | 8/1988 | Korn |
| 4,787,050 A | 11/1988 | Suzuki |
| 4,792,849 A | 12/1988 | McCalley |
| 4,811,325 A | 3/1989 | Sharples |
| 4,825,054 A | 4/1989 | Rust |
| 4,829,570 A | 5/1989 | Schotz |
| 4,868,832 A | 9/1989 | Marrington |
| 4,920,432 A | 4/1990 | Eggers |
| 4,922,420 A | 5/1990 | Nakagawa |
| 4,924,378 A | 5/1990 | Hershey |
| 4,926,485 A | 5/1990 | Yamashita |
| 4,937,807 A | 6/1990 | Weitz |
| 4,949,187 A | 8/1990 | Cohen |
| 4,956,768 A | 9/1990 | Sidi |
| 4,958,835 A | 9/1990 | Tashiro |
| 4,999,806 A | 3/1991 | Chernow |
| 5,012,121 A | 4/1991 | Hammond |
| 5,041,921 A | 8/1991 | Scheffler |
| 5,058,089 A | 10/1991 | Yoshimara |
| 5,138,712 A | 8/1992 | Corbin |
| 5,155,847 A | 10/1992 | Kirouac |
| 5,163,131 A | 11/1992 | Row |
| 5,166,886 A | 11/1992 | Molnar |
| 5,191,573 A | 3/1993 | Hair |
| 5,191,611 A | 3/1993 | Lang |
| 5,192,999 A | 3/1993 | Graczyk |
| 5,197,094 A | 3/1993 | Tillery |
| 5,203,028 A | 4/1993 | Shiraishi |
| 5,237,157 A | 8/1993 | Kaplan |
| 5,237,322 A | 8/1993 | Heberle |
| 5,239,480 A | 8/1993 | Huegel |
| 5,250,747 A | 10/1993 | Tsumura |
| 5,252,775 A | 10/1993 | Urano |
| 5,260,999 A | 11/1993 | Wyman |
| 5,262,875 A | 11/1993 | Mincer et al. |
| 5,276,866 A | 1/1994 | Paolini |
| 5,315,161 A | 5/1994 | Robinson |
| 5,339,413 A | 8/1994 | Koval |
| 5,341,350 A | 8/1994 | Frank |
| 5,355,302 A | 10/1994 | Martin |
| 5,357,276 A | 10/1994 | Banker |
| 5,369,778 A | 11/1994 | SanSoucie |
| 5,375,206 A | 12/1994 | Hunter |
| 5,418,713 A | 5/1995 | Allen |
| 5,420,923 A | 5/1995 | Beyers |
| 5,428,252 A | 6/1995 | Walker |
| 5,431,492 A | 7/1995 | Rothschild |
| 5,445,295 A | 8/1995 | Brown |
| 5,455,926 A | 10/1995 | Keele |
| 5,457,305 A | 10/1995 | Akel |
| 5,465,213 A | 11/1995 | Ross |
| 5,475,835 A | 12/1995 | Hickey |
| 5,481,509 A | 1/1996 | Knowles |
| 5,495,610 A | 2/1996 | Shing |
| 5,496,178 A | 3/1996 | Back |
| 5,499,921 A | 3/1996 | Sone |
| 5,511,000 A | 4/1996 | Kaloi |
| 5,513,117 A | 4/1996 | Small |
| 5,548,729 A | 8/1996 | Akiyoshi |
| 5,550,577 A | 8/1996 | Verbiest |
| 5,555,244 A | 9/1996 | Gupta |
| 5,557,541 A | 9/1996 | Schulhof |
| 5,559,505 A | 9/1996 | McNair |
| 5,559,549 A | 9/1996 | Hendricks |
| 5,561,709 A | 10/1996 | Remillard |
| 5,566,237 A | 10/1996 | Dobbs |
| 5,570,363 A | 10/1996 | Holm |
| 5,579,404 A | 11/1996 | Fielder et al. |
| 5,583,994 A | 12/1996 | Rangan |
| 5,592,551 A | 1/1997 | Lett |
| 5,594,509 A | 1/1997 | Florin |
| 5,612,581 A | 3/1997 | Kageyama |
| 5,613,909 A | 3/1997 | Stelovsky |
| 5,619,247 A | 4/1997 | Russo |
| 5,619,698 A | 4/1997 | Lillich |
| 5,623,666 A | 4/1997 | Pike |
| 5,642,337 A | 6/1997 | Oskay |
| 5,644,714 A | 7/1997 | Kikinis |
| 5,644,766 A | 7/1997 | Coy |
| 5,668,592 A | 9/1997 | Spaulding |
| 5,668,788 A | 9/1997 | Allison |
| 5,684,716 A | 11/1997 | Freeman |
| 5,691,778 A | 11/1997 | Song |
| 5,697,844 A | 12/1997 | Von Kohorn |
| 5,703,795 A | 12/1997 | Mankowitz |
| 5,708,811 A | 1/1998 | Arendt |
| 5,712,976 A | 1/1998 | Falcon |
| 5,726,909 A | 3/1998 | Krikorian |
| 5,734,719 A | 3/1998 | Tsevdos |
| 5,734,961 A | 3/1998 | Castille |
| 5,761,655 A | 6/1998 | Hoffman |
| 5,762,552 A | 6/1998 | Vuong |
| 5,774,668 A | 6/1998 | Choquier |
| 5,774,672 A | 6/1998 | Funahashi |
| 5,781,889 A | 7/1998 | Martin |
| 5,790,172 A | 8/1998 | Imanaka |
| 5,790,671 A | 8/1998 | Cooper |
| 5,790,856 A | 8/1998 | Lillich |
| 5,793,980 A | 8/1998 | Glaser |
| 5,798,785 A | 8/1998 | Hendricks |
| 5,802,599 A | 9/1998 | Cabrera |
| 5,808,224 A | 9/1998 | Kato |
| 5,809,246 A | 9/1998 | Goldman |
| 5,832,287 A | 11/1998 | Atalla |
| 5,835,843 A | 11/1998 | Haddad |
| 5,845,104 A | 12/1998 | Rao |
| 5,848,398 A | 12/1998 | Martin |
| 5,854,887 A | 12/1998 | Kindell |
| 5,862,324 A | 1/1999 | Collins |
| 5,864,870 A | 1/1999 | Guck |
| 5,867,714 A | 2/1999 | Todd |
| 5,884,028 A | 3/1999 | Kindell |
| 5,884,298 A | 3/1999 | Smith |
| 5,887,193 A | 3/1999 | Takahashi |
| 5,913,040 A | 6/1999 | Rakavy |
| 5,915,094 A | 6/1999 | Kouloheris |
| 5,915,238 A | 6/1999 | Tjaden |
| 5,917,537 A | 6/1999 | Lightfoot |
| 5,917,835 A | 6/1999 | Barrett |
| 5,923,885 A | 7/1999 | Johnson |
| 5,930,765 A | 7/1999 | Martin |
| 5,931,908 A | 8/1999 | Gerba |
| 5,949,688 A | 9/1999 | Montoya |
| 5,959,869 A | 9/1999 | Miller |
| 5,959,945 A | 9/1999 | Kleiman |
| 5,966,495 A | 10/1999 | Takahashi |
| 5,978,855 A | 11/1999 | Metz |
| 6,002,720 A | 12/1999 | Yurt |
| 6,009,274 A | 12/1999 | Fletcher |
| 6,018,337 A | 1/2000 | Peters |
| 6,018,726 A | 1/2000 | Tsumura |
| 6,072,982 A | 6/2000 | Haddad |
| 6,151,634 A | 11/2000 | Glaser |
| 6,341,166 B1 * | 1/2002 | Basel ............................ 381/103 |
| 6,498,855 B1 | 12/2002 | Kokkosoulis et al. |
| 6,522,707 B1 | 2/2003 | Brandstetter et al. |
| 6,744,882 B1 | 6/2004 | Gupta et al. |
| 7,107,109 B1 * | 9/2006 | Nathan et al. ................... 700/94 |
| 2001/0016815 A1 | 8/2001 | Takahashi et al. |

FOREIGN PATENT DOCUMENTS

| | | |
|---|---|---|
| DE | 3723737 A1 | 1/1988 |
| DE | 3820835 A1 | 1/1989 |
| DE | A 3820835 | 1/1989 |
| DE | 4244198 | 6/1994 |
| DE | 19610739 | 9/1997 |
| EP | A 0082077 | 6/1983 |
| EP | 0140593 A2 | 5/1985 |
| EP | 0256921 | 2/1988 |
| EP | 0 283 304 | 9/1988 |
| EP | A 0283350 | 9/1988 |
| EP | 0309298 | 3/1989 |
| EP | A 0313359 | 4/1989 |
| EP | 0340787 | 11/1989 |
| EP | 0 363 186 | 4/1990 |
| EP | 0 425 168 A | 5/1991 |
| EP | 0464562 A2 | 1/1992 |
| EP | 0 480 558 | 4/1992 |
| EP | 0498130 | 8/1992 |
| EP | 0498130 A2 | 8/1992 |
| EP | 0 507 110 | 10/1992 |
| EP | 0538319 B1 | 4/1993 |
| EP | A 0631283 | 12/1994 |
| EP | 0632371 | 1/1995 |
| EP | 0786122 B1 | 7/1997 |
| EP | 0817103 | 1/1998 |
| EP | 0841616 A2 | 5/1998 |
| EP | 0919964 | 6/1999 |
| EP | 0959570 A1 | 11/1999 |
| EP | 0 974896 A1 | 1/2000 |
| EP | 0982695 | 3/2000 |
| FR | A 2602352 | 2/1988 |
| GB | A 2122799 | 1/1984 |
| GB | 2166328 A | 4/1986 |
| GB | 2170943 | 8/1986 |
| GB | 2193420 | 2/1988 |
| GB | 2 238680 A | 6/1991 |
| GB | 2259398 | 3/1993 |
| GB | 2262170 A | 6/1993 |
| JP | 57-173207 | 10/1982 |
| JP | 58-179892 | 10/1983 |
| JP | 60-253082 | 12/1985 |
| JP | 62-192849 | 8/1987 |
| JP | 62-284496 | 12/1987 |
| JP | 63-60634 | 3/1988 |
| JP | 2-153665 | 6/1990 |
| JP | 5-74078 | 3/1993 |
| JP | 07281682 | 10/1995 |
| JP | 08-279235 | 10/1996 |
| JP | 10-098344 | 4/1998 |
| WO | WO 86 01326 A | 2/1986 |
| WO | WO A 90 07843 | 7/1990 |
| WO | WO 91/08542 | 6/1991 |
| WO | WO A 91 20082 | 12/1991 |
| WO | WO 93/16557 | 8/1993 |
| WO | WO A 93 18465 | 9/1993 |
| WO | WO A 94 03894 | 2/1994 |
| WO | WO 94/14273 | 6/1994 |
| WO | WO 94/15306 | 7/1994 |
| WO | WO 94 15416 A | 7/1994 |
| WO | WO 95 03609 A | 2/1995 |
| WO | WO95/29537 | 11/1995 |
| WO | WO 96/12255 | 4/1996 |
| WO | WO 96/12256 | 4/1996 |
| WO | WO 96/12257 | 4/1996 |
| WO | WO 96 12258 A | 4/1996 |
| WO | WO 98/45835 | 10/1998 |
| WO | WO 01/00290 | 1/2001 |

OTHER PUBLICATIONS

Bonczck, Robert H. et al, "The DSS Development System", 1983 National Computer Conference, Anaheim, California, May 16-19, 1983, pp. 441-455.

"Robotic Wafer Handling System for Class 10 Environments" IBM Technical Disclosure Bulletin, vol. 32, No. 9A, Feb. 1990, pp. 141-143.

"High-speed Opens and Shorts Substrate Tester", IBM Technical Disclosure Bulletin, vol. 33, No. 12, May 1991, pp. 251-259.

"Darts Revolution Again", Replay Magazine, Mar. 1991, pp. 146-148.

Galen A. Grimes, "Chapter 18, Taking Advantage or Web-based Audio."

Petri Koskelainem "Report on Streamworks ™".

W. Richard Stevens, "TCP/IP Illustrated: vol. 1, the Protocols".

Nowell Outlaw "Virtual Servers Offer Performance benefits for Networks Imaging".

IBM Technical Disclosure Bulletin, vol. 30, No. 5, Oct. 1987, "Method for Automated Assembly of Software Versions", pp. 353-355.

Pohlmann, Principles of Digital Audio, Third Edition, 1995.

* cited by examiner

PROCESS FOR ADJUSTING THE SOUND VOLUME OF A DIGITAL SOUND RECORDING

This application is a continuation of U.S. Pat. No. 7,107,709, issued Sep. 12, 2006, which claims priority to French Application No. 0001905, filed Feb. 16, 2000, the entire content of which is hereby incorporated by reference in this application.

FIELD OF THE INVENTION

The present invention relates to a process for adjusting the sound volume of a digital sound recording reproduced by an item of equipment. This process is essentially intended to be used during the reproduction of a digital recording in the form of a data file by means of a sound card, for example, of an audiovisual reproduction system, such as a jukebox.

BACKGROUND OF THE INVENTION

In the prior art, it is known that digital recordings, such as compact disks (CD), are not reproduced with the same sound volume for a specified sound setting level. This is essentially due to the type of music and the way in which the piece of music was recorded. Indeed, a sound frame is composed of an electrical signal comprising a succession of oscillations and peaks. Each peak corresponds to a voltage value. The higher the voltage in terms of absolute value, the higher the volume and the higher the slope of the signal variation, the higher the frequency of the sound reproduced. When such a recording is recorded in the form of a digital file and then reproduced on a sound system by means of a digital sound card on a computer, the same maximum variation phenomena are observed since the data contained in the file is approximately the same as that recorded on a CD. Consequently, between two recordings of different types of music, it is necessary to modify the sound level setting between two recordings, to obtain a reproduction with the same sound level for two different recordings with different original sound levels.

OBJECTS AND SUMMARY OF THE INVENTION

Therefore, the purpose of the present invention is to remedy the disadvantages of the prior art by proposing a process for adjusting the sound level of a digital sound recording making it possible to obtain identical sound levels in different recordings, irrespective of the differences in the digital sound recording level existing initially between each of the recordings.

This purpose is achieved by the fact that the process comprises:
a step consisting of determining, in absolute values, for a recording, the maximum amplitude values for sound frequencies audible for the human ear,
a step consisting of calculating the possible gain for a specified sound level setting, between the maximum amplitude value determined above and the maximum amplitude value for all frequencies combined,
a step consisting of reproducing the recording with a sound card by automatically adjusting the amplification gain level making it possible to obtain a sound level for the recording of a specified value so that it corresponds to the gain calculated for this recording.

According to another feature, the maximum amplitude value determination step comprises:
a step consisting of counting the number of samples of the recording with a specified amplitude, for all the amplitudes existing in the recording,
a step consisting of classifying the amplitudes of the number of samples found in increasing order,
a step consisting of storing in memory the maximum amplitude, for all frequencies combined, and the amplitude, for which the order number in the classification carried out is n ranks less with reference to the rank of the maximum amplitude, the amplitude found corresponding in this case to the maximum amplitude for frequencies audible for the human ear.

According to another feature, n is determined so that the degradation of the reproduction quality of the recording is not perceptible to the human ear.

According to another feature, n is of the order of 10 and preferably equal to 4 or 5.

According to another feature, the maximum amplitude value determination step comprises:
a step consisting of counting the number of samples of the recording with a specified amplitude, for all the amplitudes existing in the recording,
a step consisting of classifying the amplitudes of the number of samples found in increasing order,
a step consisting of calculating the mean value A mean of the n' highest amplitudes occurring at least k' times in the recording.

According to another feature, the maximum amplitude value determination step comprises:
a step consisting of compressing the recording by means of at least one psycho-acoustic mask making it possible to eliminate inaudible sounds from the initial recording,
a step consisting of decompressing the recording,
a step consisting of searching the maximum amplitude on the decompressed recording, this amplitude corresponding in this case to the maximum amplitude for frequencies audible for the human ear.

According to another feature, the psycho-acoustic mask(s) is/are applied using the MPEG-1 Layer 3 process.

According to another feature, the reproduction step comprises a dynamic reproduction sound level adjustment step on the recording consisting of authorising a specified gain for the low-pitched and/or high-pitched sounds in the recording, the gain corresponding approximately to the attenuation applied during the reproduction of the recording.

Another purpose of the invention consists of a use of the process according to the invention in an audiovisual reproduction system, such as a digital jukebox.

This purpose is achieved by the fact that the automatic volume adjustment process is used on a digital audiovisual reproduction system, this use being characterised in that the recording is stored in memory in the reproduction system with the corresponding calculated gain and audiovisual reproduction system reading means giving access to the gain value to control the gain circuits of the digital signal processing processor of the digital audiovisual reproduction system to adjust the sound level accordingly.

BRIEF DESCRIPTION OF DRAWINGS

Other features and advantages of the present invention will be understood more clearly upon reading the description below with reference to the appended drawings, wherein.

DESCRIPTION OF THE PREFERRED EMBODIMENTS

Before starting the description of the invention, it is necessary to give some notes on digital recording. First of all, sound reproduction by a loud speaker consists of applying voltages of specified levels to said loud speaker, according to a specified frequency to vibrate a membrane and, therefore, produce the sound corresponding to the specified frequency. For a given amplification value, the root mean square voltage value defines the sound volume or sound level.

Figure 3:
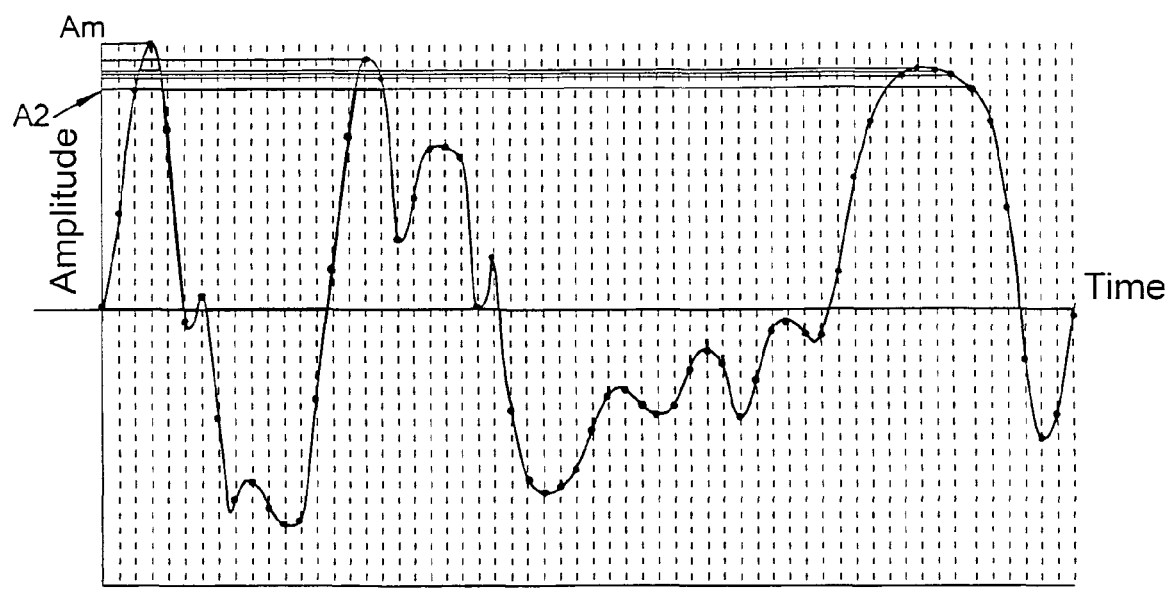
FIG. 3 represents a sound frame of a recording.

A sound frame, represented in FIG. 3, is therefore formed by superimposing oscillations representing the variations over time of the amplitude of the power supply voltage of an acoustic reproduction component such as a loud speaker. The digitisation of a sound recording consists, in fact, of performing sampling of the sound frame and, therefore, reading the voltage values according to time intervals determined by a periodicity. The shorter the period, the more precise the digitisation. During the reproduction of the recording, the analogue signal is reconstructed from digital samples stored during the digitisation. The dots on the curve represent the samples used during the digitisation.

In this way, depending on the type of music, the curve C representing the frequency of the reproduced sound, defined by the slope of the curve C and the corresponding voltage value of the maximum sound levels, for the same sound amplification circuit setting, the output level of the loud speakers will be different. Indeed, the maximum root mean square voltages observed for a first recording will not necessarily be of the same order as the maximum root mean square voltages observed for a second recording. Therefore, the purpose of the invention is to provide a solution for this disadvantage such that, between two recordings, the volume or sound level perceived by the listener is automatically adjusted so that the sound level is the same from one recording to another.

The invention requires, firstly, a preliminary analysis of each recording liable to be reproduced on an audiovisual reproduction system or on a computer and, secondly, a correction of the amplification level during the sound reproduction of the recording, according to the analysis.

A first solution consists of searching, in absolute values, the maximum voltage observed on each recording, and using this value to amplify the recordings such that, for a specified sound level setting, this values reaches the same voltage value for all the recordings. However, a sound frame of a recording comprises sounds with frequencies that are both audible and inaudible for the human ear. In this way, if the maximum amplitude corresponds to an inaudible frequency, the adjustment of the volume will not be adapted.

Figure 2A:
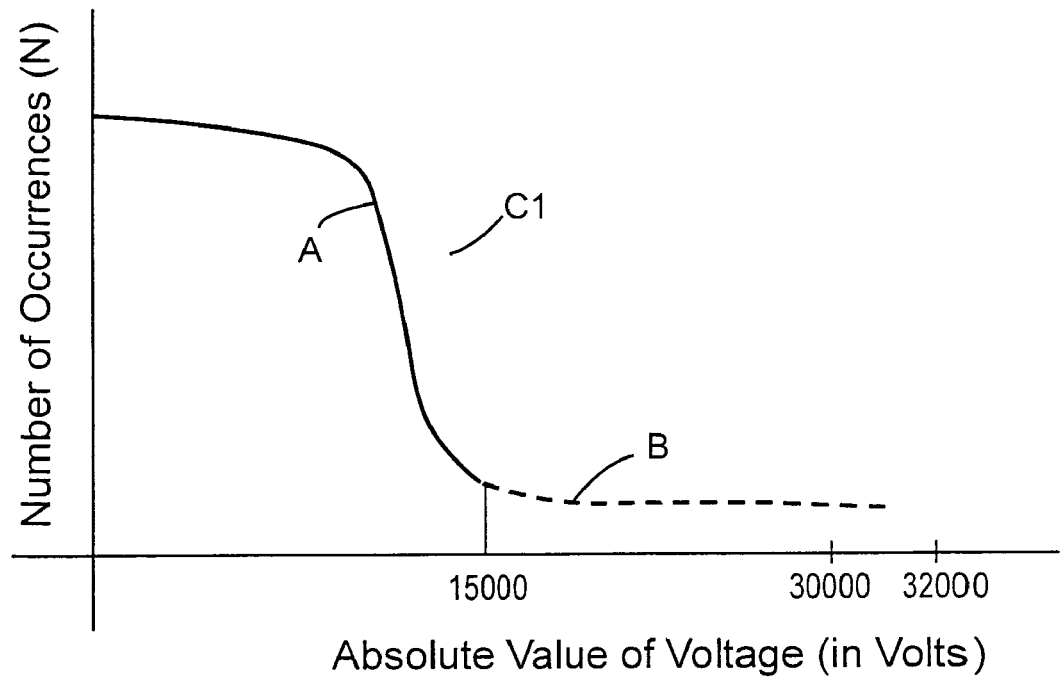
FIGS. 2A and 2B represent a curve representing the frequency of the occurrence of a voltage in a digital recording.

Therefore, the process according to the invention consists, in a first step, of determining, for a recording, the maximum amplitude only for frequencies audible for the human ear. In a first embodiment variant, this maximum amplitude is determined by analysing the digital recording to classify the number of samples of the recording for each amplitude, in increasing order of amplitude, in absolute values. This classification is represented in FIG. 2A. The Y-axis represents the number N of occurrences of a specified amplitude in the recording and the X-axis represents in absolute values the number representing the voltage of the analogue signal in volts during the digital encoding of the analogue signal with a precision of 16 bits. During the digitisation of the analogue signal representing a sound signal, each sampled voltage is encoded with a number between −32767 and 32767 when the precision is 16 bits.

Empirically, it is observed that a recording corresponding to a song only comprises a few samples, of the order of ten, located in the portion B of the curve C1, with the highest amplitudes in the recording. In this way, the portion B of the curve C1 is represented with dashes to show that all the values of the numbers representing the voltages of the corresponding analogue signal are not represented. Similarly, it is observed that 90% of the samples of a recording have a low amplitude, i.e. located in the portion A of the curve C1.

According to the invention, the maximum amplitude is selected, in the classification carried out, as the amplitude n ranks less with reference to the rank of the maximum amplitude sample of the recording. In other words, if 1 corresponds to the rank of the number representing the amplitude and K is the rank of the number representing the maximum amplitude found on the digital recording, then the amplitude selected as the maximum amplitude for the process corresponds to the rank number K−n, from the classification defined and corresponding to the curve C1. In this way, the n−1 samples, located on portion B of the curve C1 are not taken into account, using the maximum amplitude as a basis, implying that these samples do not appear in the final reproduction. Then, the recording volume correction, i.e. the possible volume gain Gv for the recording is determined by applying the following formula:

$$Gv = 20 \log(A_2/Am) \qquad a$$

In this formula, $A_2$ is the selected amplitude and Am is the maximum amplitude of the recording.

In practice, the higher the value of n, the more degraded the recording reproduction quality. Indeed, the higher the value of n, the higher the number of high-amplitude samples that will not be taken into account, and the higher the probability of the samples not taken into account corresponding to audible signals. Consequently, when the gain calculated using the above formula is applied to the recording, some sound frequencies will be over-amplified, resulting in a saturation phenomenon on the loud speakers and, therefore, in a degradation of the reproduction quality. It has been observed that a value of n of the order of 10, preferably equal to 4 to 5, does not induce a perceptible degradation during the reproduction of the recording after applying the gain calculated using the formula above. This variant can only be applied effectively to digital recordings that have not undergone prior compression or processing aiming to optimise the volume level.

On the basis of the classification carried out above, another variant for determining the value of the selected amplitude may be carried out. According to this variant, the value of the selected amplitude corresponds to the mean value $A_{mean}$ of the n' highest amplitudes occurring at least k' times in the recording. Then, the value of the possible volume gain Gv for the recording is determined by applying the formula a above, replacing $A_2$ by $A_{mean}$.

The experiment showed that, by choosing n' equal to 2 and k' equal to 4, the sound recording reproduction did not show any degradation audible for the human ear. The higher the values of n' and k', the higher the degradation of the sound recording reproduction.

Figure 2B:
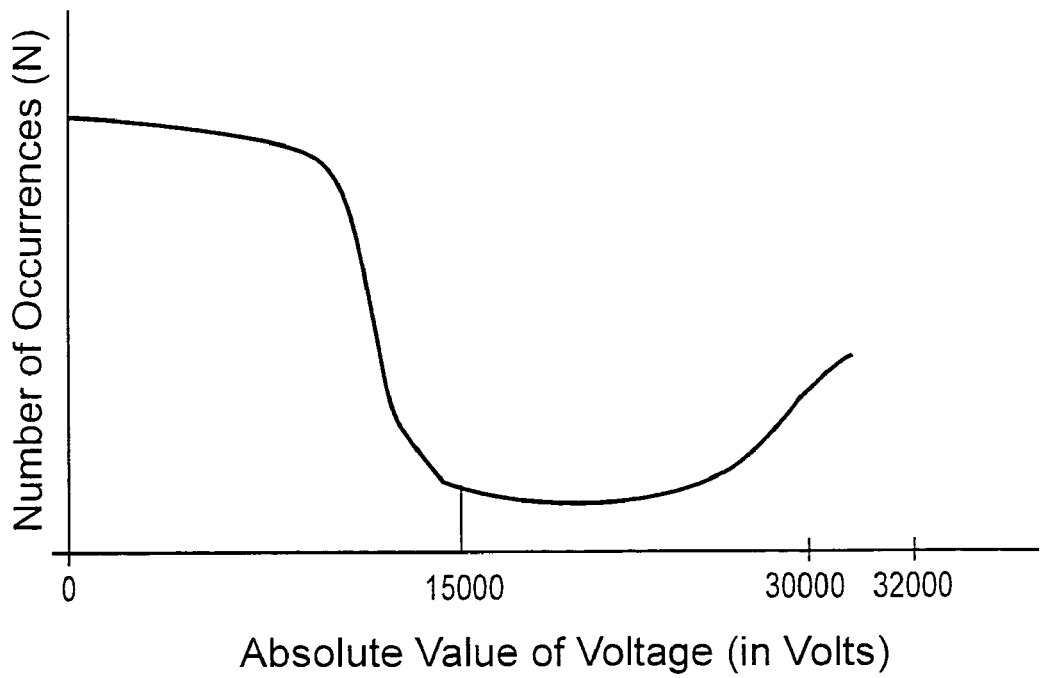

FIG. 2B represents the result of the classification carried out on a recording having undergone processing aiming to optimise the sound level. Indeed, recordings that have undergone this type of processing already take the presence of inaudible frequencies into consideration and tend to eliminate these frequencies for the benefit of improved recording volume management. For these specific recordings having undergone processing to optimise the volume, since the number of samples with a high amplitude value is higher, these amplitudes also correspond to audible signals. Consequently, the step described above is applicable but results in a perceptible degradation of the reproduction of the recording.

For recordings having undergone optimisation processing, the determination step of the maximum amplitude for audible signals consists of compressing the recording according to a compression process using at least one psycho-acoustic mask making it possible to eliminate inaudible sounds from the recording. For example, it is possible to use the known MPEG-1 Layer 3 process or any other compression process such as AAC. Indeed, it is known that the MPEG compression process uses masks to eliminate any unnecessary data from the recording. The unnecessary data in the sound recording includes all the inaudible frequencies and all the sound variations which are not perceptible to the human ear. Then, the recording is decompressed and the value of the maximum amplitude is located in this decompressed recording. In this way, during the decompression, the decompressed recording only contains audible frequency sounds. Searching the maximum amplitude in this decompressed recording does not necessarily produce a maximum amplitude Am for an audible frequency. In this embodiment variant, it is also advisable to store in memory before compression, the maximum amplitude of the recording, for all frequencies combined, in order to be able to calculate the gain according to the formula a. This second embodiment variant may be applied to any type of recording, since the MPEG compression process is indifferent to the initial recording type.

The gain value calculated by means of the formula a is then stored in memory with the sound recording produced, for example, on a server or on the audiovisual reproduction system, and used during the recording reproduction by the reproduction system. Indeed, during the reproduction of the initial digital recording, the gain calculated for this recording is added during the sound setting.

The process according to the invention is particularly used when digital recordings are reproduced by means of a sound card of a computer or an audiovisual data reproduction system. Therefore, the process according to the invention requires having determined the gain either arbitrarily or using a preliminary analysis of each recording liable to be reproduced by the sound card. As described above, this analysis consists of determining the gain liable to be applied to each recording during its reproduction. The gain is, for example, stored in memory in a database on storage means of the computer or reproduction system and can be accessed by the sound card management program, such that each recording stored on the storage means of the computer or the reproduction system is associated with a gain in the database. In this way, before the reproduction of a specified recording, the sound card management program consults its database and collects the data representing the gain calculated for this recording. During the setting of the sound of the recording, the level selected by the user will be automatically adjusted by a value corresponding to the calculated gain Gv, such that the real sound level indeed corresponds to the level selected by the user and is homogeneous for all the recordings contained in the storage means. The adjustment may be made by a positive or negative value.

Another variant of the process according to the invention consists of adjusting the gain for the sound signals of a recording corresponding to low-pitched and/or high-pitched sounds. The aim of the process is to increase, when possible, the gain for low-pitched and/or high-pitched sounds without exceeding the sound level selected by the user and without exceeding a maximum gain set for low-pitched and/or high-pitched sounds. It is necessary to underline that, in this variant, only low-pitched and/or high-pitched sounds are concerned by the dynamic gain adjustment, when the reproduction enables independent setting of the general sound level and the sound level of low-pitched and/or high-pitched sounds. In this way, when the sound level of low-pitched and/or high-pitched sounds is less than the sound level selected by the user, an additional gain is authorised on low-pitched and/or high-pitched sounds to increase the perception of low-pitched and/or high-pitched sounds to improve the reproduction quality of the recording. This additional gain will be at most equal to the gain requested by the user for low-pitched and/or high-pitched sounds.

The maximum volume is obtained when the incoming signal on the amplifier is not attenuated, i.e. at a gain of 0 dB. So as to obtain a gain for low-pitched and/or high-pitched sounds systematically, the overall maximum volume for the recording may be less than zero dB and the maximum volume of low-pitched and/or high-pitched sounds is determined so that the incoming gain in the amplifier can be equal to zero dB. Consequently, it is always possible to obtain a gain for low-pitched and/or high-pitched sounds corresponding to the absolute value of the recording volume attenuation. In this way, for example, if the recording volume attenuation is −3 dB, the gain for low-pitched and/or high-pitched sounds is 3 dB. So as to limit the influence of the dynamic adjustment of low-pitched and/or high-pitched sounds, the maximum low-pitched and/or high-pitched sound gain is limited, for example to 12 dB. In this way, even if, for a specified volume, the gain for low-pitched and/or high-pitched sounds may be 16 dB, for example, it will only actually be 12 dB.

Figure 1:
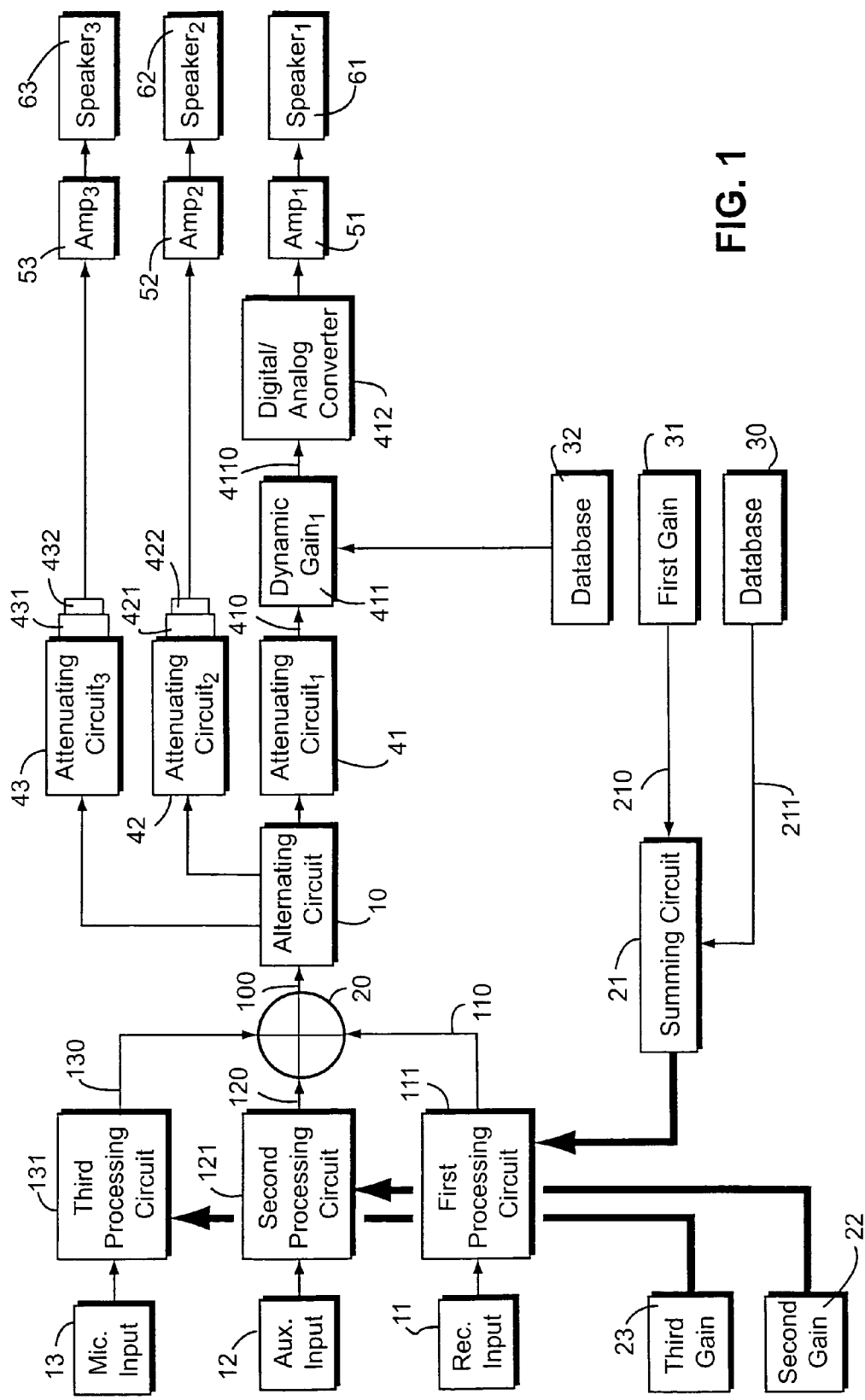
FIG. 1 represents a block diagram of a sound card using the process according to the invention.

For example, FIG. 1 represents a block diagram of a sound card using the process according to the invention. This sound card is connected, for example, to a central processing unit (not shown) of a computer or a reproduction system comprising, particularly, storage means in which a sound card management program, or pilot, is particularly stored. The sound card represented in FIG. 1 comprises, for example, 3 inputs 11, 12, 13. A first input 11 receives the signals representing the recordings, for example, through an MPEG decoder, the second input 12 receives signals from an auxiliary source and the third input 13 receives signals from a microphone. The signals from the different inputs are converted, if required, into digital signals. Then, the sound card management program assigns each input 11, 12, 13, by means of a first processing circuit 111, 121, 131, with a gain 21, 22, 23 corresponding to that stored in the central processing unit database linked with the recording produced. For the microphone input 13 and the auxiliary source input 12, this is a predefined gain 22, 23, set according to the characteristics of the microphone and auxiliary source. For the input 11 receiving the signals corresponding to the recordings, the sound card management program collects, in its database 30 stored in the central processing unit, the gain calculated according to the formula a for the incoming recording on the first input and a gain 31 accounting for the use of an MPEG decoder, for example. These two gains are then applied to the inputs 210, 211 of a summing circuit 21, the output of which is connected to the first processing circuit 111 linked to the input 11 of the MPEG decoder. The three signals 110, 120, 130 modified in this way are then summed and mixed by a signal summer 20, to form a single signal 100. This signal 100 is then attenuated by an attenuating electronic circuit 10 of a specified fixed value.

Indeed, if the sound levels of the input signals 110, 120, 130 are all similar to the sound level selected by the user, then the sum of these signals will necessarily exceed this maximum level selected by the user, hence the need to reduce the sound level of the signal resulting from the sum of the tree signals 110, 120, 130 systematically so that, in the most unfavourable case, it is not greater than the maximum level selected by the user. The signal 100 is then assigned to at least one zone, e.g. three. The term zone refers to an area equipped with at least one loud speaker 61, 62, 63 connected to the sound card by means of an amplifier 51, 52, 53. For each zone, the sound level of the signal is modified according to the maximum sound level selected by the user for each of these zones. To do this, the maximum level selected by the user for each zone is previously stored in memory, for example, in a database of the central processing unit, and then, during reproduction, collected by the sound card management program and sent to an attenuating circuit 41, 42, 43 linked with each zone. Then, the signal 410 modified in this way according to the setting of each zone may be modified again by a dynamic gain 411, 421, 431 assigned to low-pitched and/or high-pitched sounds, as described above. To do this, the sound card management program assigns a gain to the low-pitched and/or high-pitched sound signals contained in the output signal of each zone. This gain corresponds to the attenuation applied to the output signal of each zone. In other words, if the output signal of a zone is attenuated, for example by 6 dB, so as not to exceed the sound level selected by the user, the low-pitched and/or high-pitched sound signals will be increased by 6 dB. The attenuation assigned to each zone is collected by the sound card management program in a database 32 or a specific file stored in the central processing unit.

Once the dynamic low-pitched and/or high-pitched sound adjustment has been carried out, the digital signal 4110 is applied to the input of a digital/analogue converter 412, 422, 423, the output of which is connected to the input of an amplifier 51, 52, 53 on which loud speakers 61, 62, 63 are connected.

It is understood that the process according to the invention makes it possible, after prior determination of the possible volume gain for each recording, to reproduce all the digital recordings analysed, with the same sound level, for the same sound setting selected by a user.

It must be clear for those experienced in the art that the present invention enables embodiments in many other specific forms without leaving the field of the invention as claimed. Consequently, the present embodiments must be considered as illustrations, but may be modified in the field defined by the scope of the claims attached, and the invention must not be limited to the details given above.

The invention claimed is:

1. A method for adjusting the sound volume of a digital sound recording, the method comprising:
   determining, in absolute values, for a recording, the maximum amplitude values for sound frequencies audible for the human ear;
   calculating the possible gain for a specified sound level setting, between the maximum amplitude value and the maximum amplitude value for all frequencies combined; and
   reproducing the recording by automatically adjusting the amplification gain level making it possible to obtain a sound level for the recording of a specified value so that it corresponds to the gain calculated for this recording,
   wherein the reproduction step comprises a dynamic reproduction sound level adjustment step on the recording including authorizing a specified gain for the low-pitched and/or high-pitched sounds in the recording, the gain corresponding approximately to the attenuation applied during the reproduction of the recording.

2. The method of claim 1, further comprising adjusting sound levels of digital sound recordings so as to obtain identical sound levels in the digital sound recordings, irrespective of differences in initially existing levels of the digital sound recordings.

3. The method of claim 1, wherein the determining comprises:
   counting a number of samples of the recoding with a specified amplitude for each amplitude existing in the recording;
   ordering the amplitudes of the number of samples found; and
   storing in a memory the maximum amplitude, for all of the frequencies combined, and an amplitude for which an order number n in the classification carried out ranks less than a rank of the maximum amplitude.

4. The method of claim 3, wherein n is determined so that a degradation of the reproduction quality of the recording is not perceptible to the human ear.

5. The method of claim 3, wherein n is on the order of 10.

6. The method of claim 3, wherein n is 4 or 5.

7. A volume adjustment device comprising dynamic adjustment means for the reproduction sound levels of a recording, accounting for a specified gain for the low-pitched and/or high-pitched sounds in the recording, the specified gain corresponding approximately to a specified volume attenuation of the recording to be assigned during the reproduction of the recording to evaluate amplifier input gain, the specified gain being increased, when possible, without exceeding a sound level selected by the user and without exceeding a maximum gain set for low-pitched and/or high-pitched sounds.

8. The volume adjustment device of claim 7, wherein the dynamic adjustment means is further configured to adjust sound levels of digital sound recordings so as to obtain identical sound levels in the digital sound recordings, irrespective of differences in initially existing levels of the digital sound recordings.

* * * * *